United States Patent [19]

Saatkamp et al.

[11] Patent Number: 4,849,701
[45] Date of Patent: Jul. 18, 1989

[54] METHOD OF TESTING THE FUNCTION OF LOAD RESISTORS CONNECTED IN PARALLEL

[75] Inventors: Richard Saatkamp, Lengerich; Dieter Borgmann, Mettingen, both of Fed. Rep. of Germany

[73] Assignee: Windmoller & Holscher, Lengerich, Fed. Rep. of Germany

[21] Appl. No.: 8,318

[22] Filed: Jan. 29, 1987

[30] Foreign Application Priority Data

Jan. 30, 1986 [DE] Fed. Rep. of Germany ....... 3602820

[51] Int. Cl.⁴ .......................................... G01R 31/02
[52] U.S. Cl. .................................. 324/549; 219/483; 219/486; 324/502; 324/522
[58] Field of Search ............. 324/539, 522, 537, 500, 324/549, 525, 65 R, 502; 219/483, 486

[56] References Cited

U.S. PATENT DOCUMENTS

| | | | |
|---|---|---|---|
| 2,567,859 | 9/1951 | Ringo | 324/549 X |
| 3,286,130 | 11/1966 | Clinton | 324/525 X |
| 3,551,796 | 12/1970 | Holder et al. | 324/529 X |
| 3,892,946 | 7/1975 | Rimmi | 219/483 X |
| 4,421,976 | 12/1983 | Jurek | 219/483 X |
| 4,604,518 | 8/1986 | Payne | 219/483 X |

Primary Examiner—Reinhard J. Eisenzopf
Assistant Examiner—Robert W. Mueller
Attorney, Agent, or Firm—Fleit, Jacobson, Cohn, Price, Holman & Stern

[57] ABSTRACT

Load resistors connected in parallel in a heating circuit having switches operable to connect and disconnect the resistors from a common supply line for heating a plurality of zones to maintain predetermined temperatures therein, are tested by disconnecting all of the load resistors from the supply line to begin a testing operation. Any current conducted when all load resistors are disconnected from the supply line is measured, after which the load resistors are then individually and successively reconnected to the supply line. The current then conducted from the supply line in succession to the load resistors is measured and compared with reference values of current through the load resistors when functioning properly.

5 Claims, 1 Drawing Sheet

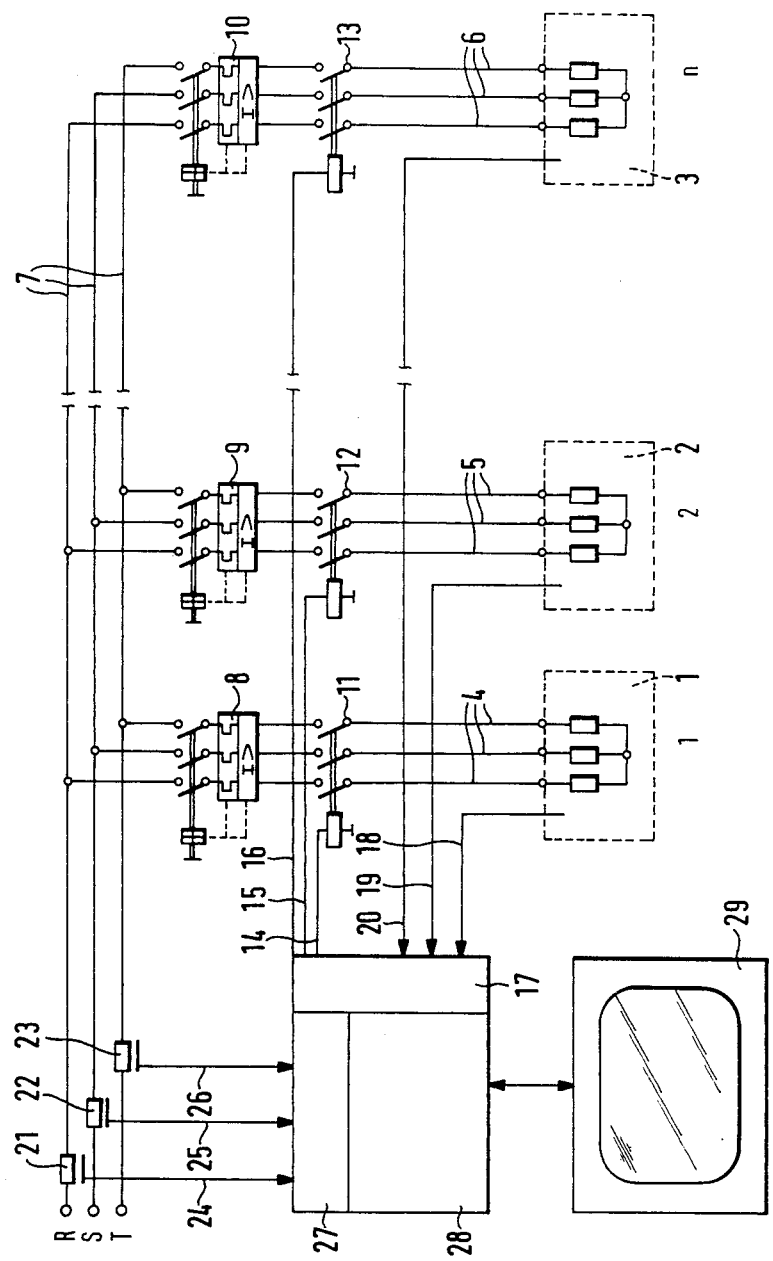

METHOD OF TESTING THE FUNCTION OF LOAD RESISTORS CONNECTED IN PARALLEL

FIELD OF THE INVENTION

This invention relates to a method of testing the function of load resistors of a heating system which are connected in parallel in a circuit which comprises switches associated with said resistors and operable to connect each resistor to and to disconnect it from a common supply line, wherein the currents flowing through the load resistors are measured and the load resistors preferably consist of heating resistors for heating annular dies of extruders for making blown tubular films or for heating slot dis of extruders for making flat films, and serve to provide for said nozzles around their periphery or along their length a predetermined temperature profile which influences the viscosity of the extruded molten material in such a manner that highly uniform film thicknesses can be achieved.

DESCRIPTION OF THE PRIOR ART

For a satisfactory production of film, the function of the heating resistors must be tested from time to time. If the several portions of the annular or elongate extrusion dies are heated by means of three heating resistors associated with respective phase conductors of the usually employed three-phase a.c., an ammeter may be associated in known manner with each heating resistor and may be used to check whether the desired heating current is flowing. If an extrusion die is divided, e.g., into nine portions corresponding to respective heating zones, $3 \times 9 = 27$ ammeters will have to be used to check the heating resistors. Slot dies may sometimes have as much as 54 heating zones and in that case a very high expenditure will be involved in the ammeters used to check the heating resistors and the working time for reading the ammeters will be high too.

It is known that the number of ammeters required can be decreased if only a single ammeter is associated with the three phase conductors connected to each heating zone and said ammeter can be connected by a manually operable selector switch to each of the phase conductors connected to the heating resistors. Whereas such an arrangement will reduce to one-third the number of ammeters required, the expenditure of the large number of ammeters which are still required is still high.

SUMMARY OF THE INVENTION

It is an object of the invention to provide a method of the kind described hereinbefore and which permits the function of the load resistors or heating resistance and of the associated circuitry to be reliably tested in a simple manner by means of a smaller number of ammeters.

In a method of the kind described hereinbefore that object is accomplished in that the current flowing in the supply line is measured at a point which precedes the first load resistor, all load resistors are disconnected from the supply line, any current flowing when all load resistors are disconnected from the supply line is measured, the load resistors are then individually and successively connected to the supply line, and the current flowing through the supply line when each load resistor is connected thereto is measured and is compared with the current which is assumed to flow through the load resistor when it functions properly. In the method in accordance with the invention the function of any desired number of laod resistors or heating resitors can be measured with one ammeter per live phase conductor. All load resistors or heating resitors are disconnected from the associated supply line at regular intervals of time amounting, e.g, to one hour, and any current which is still flowing when all load resistors have been disconnected is measured. If that measured current is zero, this means that all heating resistors have been disconnected and the associated relays or switches do not "stick" and function properly. The individual heating resistors are then connected in succession to the supply line in that the respective switches are closed so that the current flowing through a single heating resistor can be measured by the ammeter at a given time. That current is then compared with the current which is assumed to flow through the properly functioning load resistor. Any deviation detected by the measurement will indicate a fault or a disturbance.

In case of unstable power supplies, the voltage is also measured and taken into account in the calculation. That correcting calculation will not be required in the case of stable power supplies because in that case the instantaneous measurement will always involve the same load and the same voltage drop.

The method in accordance with the invention permits a reliable check as to whether a switch or a relay sticks so that current is fed to a heating resistor which ought to be deenergized.

In case of polyphase supply lines the current flowing in each phase conductor will be measured.

The measured values can simply be checked if the desired values and the measured actual values of the respective currents are displayed in juxtaposition on a monitor.

BRIEF DESCRIPTION OF THE DRAWING

The single FIGURE of the drawing shows a circuit diagram of illustrative circuitry for testing the function of heating resistors connected in parallel in accordance with the invention.

DETAILED DESCRIPTION OF THE PREFERRED EMBODIMENT

The circuitry shown on the drawing will now be explained more in detail with reference to the drawing.

Boxes defined by dotted lines represent the first heating zone 1, the second heating zone 2 and the n-th heating zone 3 of an extrusion die. Each box contains a representation of three heating resistors to be supplied with three-phase a.c. Each zone is connected to three live phase conductors 4, 5 and 6, which are connected to a main power supply line 7. Each of the three phase conductors 4, 5, and 6 is protected by a miniature circuit breaker 8, 9 or 10, which consists of a conventional motor circuit breaker and for an overcurrent release.

Each of the three phase conductors 4, 5, 6 also incorporates an on-off switch 11, 12 or 13, which are connected by respective leads 14, 15 and 16 to a control and comparing unit 17, which is connected by leads 18, 19, 20 to respective temperature sensors, not shown. Said temperature sensors are arranged in the respective heating zones. In the controller 17 the temperatures measured in the respective heating zones are compared with preset desired temperatures and the controller will close the associated on-off switch for a predetermined time as soon as a temperature sensor indicates an insufficient temperature. This will ensure that the desired temperature is maintained in each of the heating zones 1 to 3. The arrangement and circuitry described thus far are known.

In each phase conductor of the main line the first heating zone is preceded by a current transformer 21, 22 or 23, from which a transformed current is delivered via a lead 24, 25 or 26 to an actual-value detector 27, in which the current is measured. A control unit 28 comprising a memory is associated with the actual-value detector 27 and the controller 17 and is used to open all on-off switches 11, 12, 13 in regular intervals of time to deenergize all heating zones. The output currents of the current transformers 21, 22, 23 are measured when all on-off switches 11, 12, 13 are open. A zero current will then indicate that the on-off switches 11, 12, 13 operate properly. The zero current is detected by the actual-value detector 27 and is displayed by the monitor 29, which is connected ot the control unit 28. After that first display, the circuits in all heating zones 1, 2, 3 are energized in succession so that two values for each heating zone will then be displayed on the monitor 29. One of said values is the actually flowing current which has been measured and the other value is the current which should flow in case of a proper function. The agreement of both values will indicate that the heating resistors in the heating zone being tested function properly. It will be obvious that a disagreement of the values displayed by the monitor 29 may initiate an audible or visual signal indicating the fault which has been detected.

By means of the circuitry which is shown the operator of the machine can be furnished in intervals of, e.g., half an hour or one hour with information on the function of the individual heating zones. The de-energization of all heating zones and the subsequent testing of all heating zones in succession will take only a few seconds so that said test will have no influence or will have only a negligible influence on the heating of the extrusion die.

The circuit which has been described permits not only an automatic testing of the function of each heating zone but affords the further advantage that in case of a heating with three-phase a.c. the test can be carried out with only three current transformers.

We claim:

1. In a method of testing a heating system having load resistors which are connected in parallel in a circuit that includes switches connecting each resistor to and disconnecting each resistor from a common supply of electrical current, the steps of: measuring current flowing in the supply at a position preceding a first of the load resistors and with the load resistors connected to the supply; then disconnecting all of the load resistors from the supply; measuring current flowing in the supply with all of the load resistors disconnected to operationally monitor disconnection of the load resistors by said switches; then individually and successively connecting the load resistors by closing of the switches to the supply and; for each resistor that is connected, measuring the current flowing through the supply to compare same with a required value of current flow for the respective resistor.

2. The method according to claim 1 wherein the supply comprises a polyphase supply having a plurality of conductors, said steps of measuring current flow being applied to each of the conductors.

3. The method according to claim 1 including the step of displaying a desired value and actual value for each of the measured current.

4. In combination with a heating system for a plurality of heating zones intermittently energized through switches from a common power source to maintain therein predetermined temperature conditions, a method for testing said heating system, including the steps of: initiating a testing operation by actuating all of the switches toward open circuit conditions to simultaneously denergize all of said heating zones for a predetermined interval of time; detecting establishment of substantially zero current from said source to the heating zones during said interval of time to verify the open circuit conditions of said switches; sequentially closing the switches upon elapse of said interval of time to re-energize the heating zones in succession with corresponding increase in loading of the common power source; measuring energizing currents from the common power source conducted in sequence to the heating zones during said reenergization thereof in succession; and comparing the sequentially measured currents with reference values to monitor proper energization of the respective heating zones.

5. The method of claim 4 wherein the testing operation terminated by re-energization of all of the heating zones, is periodically performed during a limited duration having a negligible effect on said maintenance of the predetermined temperature conditions within said heating zones by the heating system.

* * * * *